United States Patent [19]
Akram et al.

[11] Patent Number: 6,048,656
[45] Date of Patent: Apr. 11, 2000

[54] VOID-FREE UNDERFILL OF SURFACE MOUNTED CHIPS

[75] Inventors: Salman Akram; Tongbi Jiang, both of Boise, Id.

[73] Assignee: Micron Technology, Inc., Boise, Id.

[21] Appl. No.: 09/310,060

[22] Filed: May 11, 1999

[51] Int. Cl.[7] .......................... H01L 21/44; H01L 21/48; H01L 23/28

[52] U.S. Cl. ...................... 430/118; 438/119; 438/127; 257/787; 257/795

[58] Field of Search ..................... 438/118, 119, 438/124, 126, 127; 257/731, 701, 787, 788, 789, 795

[56] References Cited

U.S. PATENT DOCUMENTS

| | | |
|---|---|---|
| 5,203,076 | 4/1993 | Banerji et al. . |
| 5,216,278 | 6/1993 | Lin et al. . |
| 5,385,869 | 1/1995 | Liu et al. . |
| 5,451,721 | 9/1995 | Isukada et al. . |
| 5,647,123 | 7/1997 | Greenwood et al. . |
| 5,677,246 | 10/1997 | Maeta et al. ............................ 439/118 |
| 5,681,757 | 10/1997 | Hayes et al. . |
| 5,697,148 | 12/1997 | Lance, Jr. et al. ..................... 438/126 |
| 5,710,071 | 1/1998 | Beddingfield et al. ................ 439/127 |
| 5,766,982 | 6/1998 | Akram et al. ........................... 438/117 |
| 5,789,278 | 8/1998 | Akram et al. . |
| 5,801,452 | 9/1998 | Farnworth et al. . |
| 5,811,879 | 9/1998 | Akram . |
| 5,817,545 | 10/1998 | Wang et al. ............................ 438/127 |
| 5,834,339 | 11/1998 | Distefano et al. . |
| 5,834,340 | 11/1998 | Sawai et al. ........................... 438/126 |
| 5,835,355 | 11/1998 | Dordi . |
| 5,844,319 | 12/1998 | Gamota et al. ........................ 257/778 |
| 5,866,442 | 2/1999 | Brand ..................................... 438/126 |
| 5,866,953 | 2/1999 | Akram et al. . |
| 5,919,329 | 7/1999 | Banks et al. ........................... 438/118 |

*Primary Examiner*—Kevin M. Picardat
*Attorney, Agent, or Firm*—Knobbe, Martens, Olson & Bear, LLP

[57] ABSTRACT

A vacuum source creates uniform flow of underfill material in the interstices between a semiconductor device and a substrate. A semiconductor device is attached to a substrate and a plurality of dams surround the semiconductor device. The dams have at least a first opening to allow underfill material to be injected into the space between the semiconductor device and the substrate. A vacuum cup is placed over a second opening and a vacuum source is applied to draw the underfill material throughout the interstices. Because the vacuum source is drawing the underfill material in a uniform manner, the underfill material fills the space without creating voids. If desired, multiple vacuum sources and multiple injection sites may be used. The underfill material may also be inserted from an aperture in the substrate located beneath the semiconductor device.

50 Claims, 5 Drawing Sheets

VOID-FREE UNDERFILL OF SURFACE MOUNTED CHIPS

BACKGROUND OF THE INVENTION

1. Field of the Invention

The present invention relates to a method and apparatus for underfilling a semiconductor device. More specifically, the present invention relates to a method and apparatus for uniformly underfilling a bumped or raised semiconductor chip to be essentially void free.

2. Description of the Related Art

Flip-chip and bumped die technology is well known in the art. A flip-chip or bumped die is a semiconductor chip having bumps on the bond pads formed on the active circuit or front side thereof, the bumps being used as electrical and mechanical connectors. The flip-chip is inverted (flipped) and bonded to a substrate by means of the bumps. Several materials are typically used to form the bumps on the die, such as conductive polymers, solder and the like. Where solder balls are employed, the die is often referred to as a Ball Grid Array (BGA). Typically, the solder bumps are reflowed to form a solder joint between the flip-chip and the substrate, forming both electrical and mechanical connections between the flip-chip and substrate. Due to the presence of the bumps on the flip-chip, a gap exists between the substrate to which the flip-chip is attached or bonded and the bottom surface of the flip-chip.

The flip-chip and the substrate typically have different coefficients of thermal expansion, operate at different temperatures, and also have different mechanical properties with differing attendant reactions to mechanical loading and stresses. Because of these differences, stress develops in the joints formed by the bumps between the flip-chip and substrate. Therefore, the bumps must be sufficiently robust to withstand such stressful conditions to maintain the integrity of the joint between the lip-chip and the substrate. To enhance the joint integrity formed by the bumps located between the flip-chip and the substrate, an underfill material comprising a suitable insulating polymer is introduced in the gap between the flip-chip and the substrate. The underfill serves to equalize stress placed on the flip-chip and substrate, to transfer heat from the flip-chip, and to protect the bump connections located between the flip-chip and the substrate from contaminants such as moisture, chemicals, and contaminating ions.

In practice, the underfill material is typically dispensed into the gap between the flip-chip and the substrate by injecting the underfill along two or more sides of the flip-chip with the underfill material flowing, usually by capillary action, to fill the gap. Alternatively, the underfill can be accomplished by backfilling the gap between the flip-chip and the substrate through a hole in the substrate beneath the chip.

However, the traditional methods of underfilling by way of capillary action have disadvantages. As devices shrink, the pads to which the bumps connect shrink commensurately. Accordingly, the bumps employed to attach substrates to the devices, via the pads, are made smaller. Shrinking bumps leave an increasingly smaller gap between the substrate and the mounted device or flip-chip. The shrinking gap between the flip-chip and the substrate inhibits filling the gap in a uniform manner.

Such non-uniform underfilling is particularly prevalent in the areas surrounding the bumps interconnecting the flip-chip to the substrate. When underfilling a flip-chip on a substrate, the underfill material generally is non-uniform in character and may contain bubbles, air pockets, or voids. This non-uniform underfill decreases the ability of the underfill material to protect the interconnections between the flip-chip and the substrate, and environmentally compromises the flip-chip, leading to a reduction in the reliability of the chip.

It would be advantageous to develop a method for performing underfill of semiconductor chips which results in underfill material that is uniform and substantially free of voids or air.

SUMMARY OF THE INVENTION

The present invention permits a uniform flow of underfill material in the interstices between a semiconductor device and a substrate. In the illustrated embodiments, a semiconductor device is attached to a substrate, and a plurality of dams substantially surround the semiconductor device. The dams have at least a first opening and a second opening to permit the insertion of the underfill material. The underfill material is injected in an opening into the space between the semiconductor device and the substrate. A vacuum cup is placed over the second opening, and a vacuum source is applied to draw the underfill material throughout the interstices. Because the vacuum source is drawing the underfill material in a uniform manner, the underfill material fills the space without creating voids. If desired, multiple vacuum sources, multiple injection sites, or multiple vacuum sources and multiple injection sites may be used.

One aspect of the present invention is a method of attaching a semiconductor device to a substrate having a gap formed therebetween. The method comprises electrically connecting the semiconductor device to the substrate and providing a dam around the semiconductor device. The dam has at least a first opening and a second opening. An underfill material is inserted into the gap from the first opening of the dam, and a vacuum is applied to the second opening of the dam. The vacuum draws the underfill material into the gap. The first opening may be located at a first corner of the dam, and the second opening may be located at a second corner of the dam. The underfill material may be inserted with a dispensing needle. In the illustrated embodiment, each opening is advantageously located at a corner of the dam, though the openings can be located elsewhere in alternative arrangements.

Another aspect of the present invention is a process for underfilling a device on a substrate. The method comprises positioning the device on a substrate such that a space is created between the device and the substrate and substantially enclosing the sides of the device with a dam. An underfill material is then inserted into at least a first opening in the dam and the underfill material is drawn into the space toward at least a second opening in the dam. Both the semiconductor device and the dam can have a generally rectangular shape, with the first opening being located at a first corner of the dam and the second opening being located diagonally across from the first opening. The underfill material is drawn toward the second opening by having the second opening at a lower pressure than the first opening. The lower pressure is advantageously provided by a vacuum source.

Advantageously, the dam can be fabricated such as to create a seal against the sides of the semiconductor device. Such a dam can be formed, for example, by using a glob top fence, or other pre-fabricated fence structures.

Another aspect of the present invention is an apparatus that provides uniform flow of underfill material in the interstices between a semiconductor device and a substrate. The apparatus comprises a first dam enclosing a first section of the semiconductor device and a second dam adjacent a second section of the semiconductor device. An underfill dispenser is positioned proximate the first dam to inject underfill material into the interstices between the semiconductor device and the substrate. A vacuum cup is positioned proximate the second dam to provide a suction force to draw the underfill material throughout the interstices. The underfill dispenser is advantageously located at a first corner of the semiconductor device, while the vacuum cup is advantageously located diagonally across from the underfill dispenser.

Another aspect of the present invention is a device for obtaining a void-free underfill in the space between a semiconductor device and a substrate. The device comprises means for substantially enclosing the semiconductor device and means for injecting underfill material into the space between the semiconductor device and the substrate. The device also includes means for drawing the underfill material throughout the space.

Another aspect of the present invention is a process for underfilling a device on a substrate. The method comprises positioning the device on a substrate such that a space is created between the device and the substrate and enclosing the sides of the device with a dam. An underfill material is inserted into an aperture in the substrate within the area beneath the device and then drawn into the space toward an opening in the dam.

Another aspect of the present invention is a device mounted to a substrate. The device comprises a dam connected to the substrate that substantially encloses the device. The dam has a first opening at a first corner of the device and a second opening at a second corner of the device. An underfill material is positioned within a gap between the device and the substrate. The underfill material increases the reliability and mechanical strength of the bond between the device and the substrate.

Another aspect of the present invention is a semiconductor mounting device. The semiconductor comprises a substrate having a plurality of electrical contacts. A semiconductor device is connected to the electrical contacts of the substrate such that a gap is formed between the semiconductor device and the substrate. A first dam is positioned proximate a first and second side of the semiconductor device. A second dam is positioned proximate a third and fourth side of the semiconductor device. An underfill material is positioned within the gap formed between the semiconductor device and the substrate to completely fill the gap. The underfill material extends from the first dam to the second dam.

BRIEF DESCRIPTION OF THE DRAWINGS

These and other features and advantages of the invention will become more apparent upon reading the following detailed description and upon reference to the accompanying drawings, in which.

DETAILED DESCRIPTION OF THE PREFERRED EMBODIMENT

Figure 1:
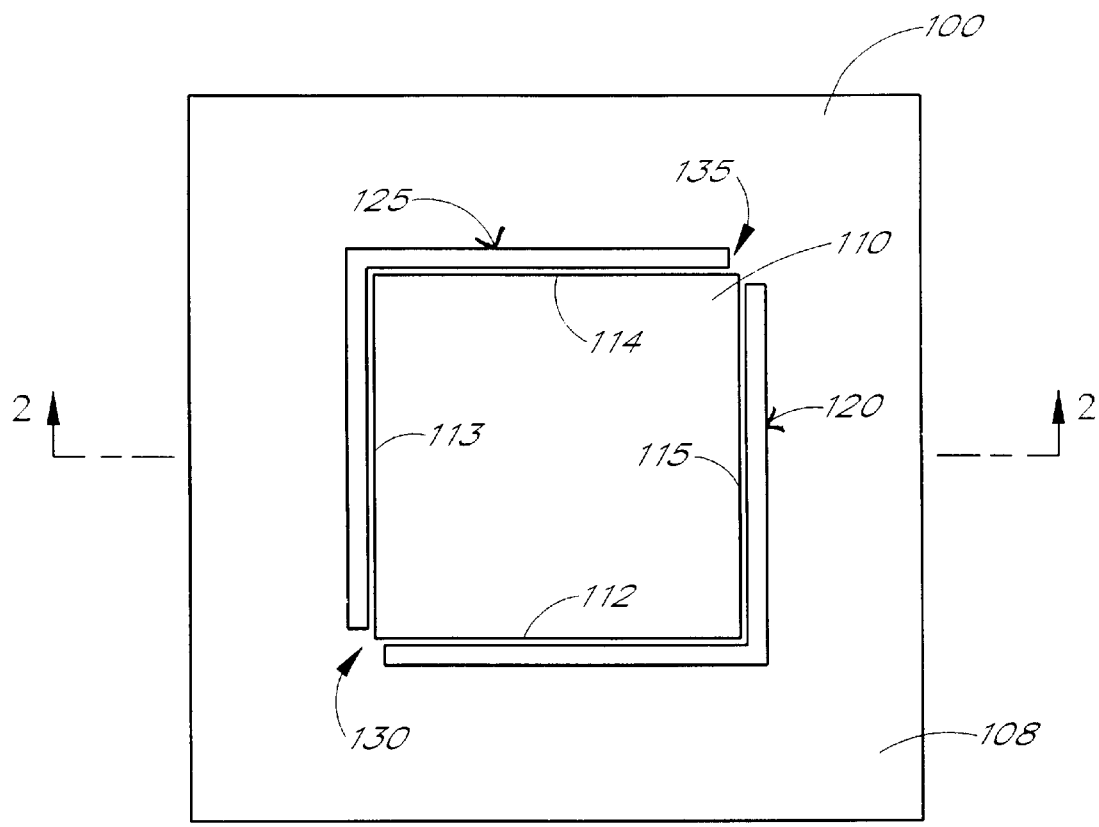
FIG. 1 is a top plan view of a surface mounted chip and a dam according to a first embodiment of the present invention.
Figure 2:
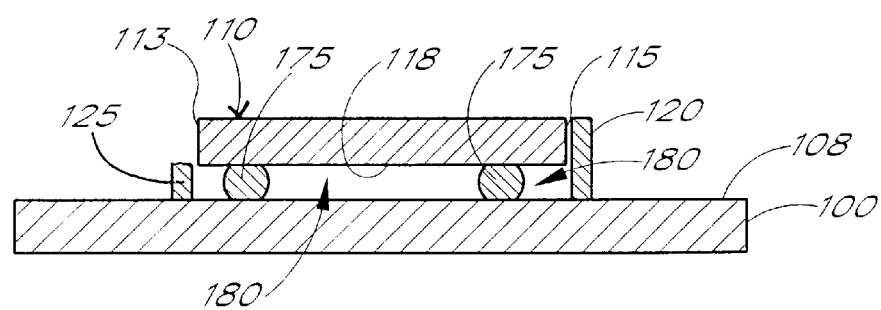
FIG. 2 is a cross-sectional view of the surface mounted chip and dam of FIG. 1.

FIGS. 1 and 2 illustrate a substrate or chip carrier 100 for connecting a semiconductor device or flip-chip 110 by conventional direct chip bonding techniques. The substrate 100 typically comprises ceramic, silicone, FR-4, BCB, polyimide, glass, or combinations thereof, and is formed as a printed circuit board (PCB) or other carrier used in flip-chip technology. The substrate 100 has a top surface 108 which includes a plurality of contact pads (not shown).

The flip-chip 110 has a front wall 112, a rear wall 114, two sidewalls 113, 115, and an active surface 118 (see FIG. 2). The active surface 118 comprises integrated circuitry and a plurality of contact pads. The contact pads have a plurality of bumps 175 thereon, particularly comprising solder balls in the illustrated embodiment, which provide both electrical and mechanical connection to the substrate 100.

An electrical assembly is produced by placing and securing the flip-chip 110 on the top surface 108 of the substrate 100. Specifically, the bumps 175 are aligned with the contact pads (not shown) of the active circuitry located on the top surface 108 of the substrate 100. The flip-chip 110 is then electrically and mechanically connected to the substrate 100 by curing or reflowing the bumps 175, depending upon the material of the bumps 175.

Alternatively, the bumps 175 may be formed on the substrate 100 prior to attachment of the flip-chip 110. Although the bumps 175 are typically formed with solder, it is understood that any other materials known in the art (e.g., gold, indium, tin lead, silver, or alloys thereof) that reflow to make electrical interconnects to the substrate 100 can also be used. Additionally, the bumps 175 can be formed of conductive polymeric and epoxy materials and may include various metals being plated thereon.

After reflowing of the bumps 175, a space or gap 180 is formed between the active surface 118 of the flip-chip 110 and the top surface 108 of the substrate 100. The size of the gap 180 is controlled by the size of the reflowed solder bumps 175 and typically varies from approximately 0.003 inches to about 0.030 inches (about 0.08 to 0.8 millimeters).

Dams or barriers 120, 125 are used on the top surface 108 of the substrate 100 to help contain the flow of an underfill material 190 (FIG. 4) from the gap 180 beneath the flip-chip 110. Conventional molding equipment and techniques (e.g., pour molding, injection molding, adhesive bonding, etc.)

can be used to form the dams 120, 125 on the substrate 100. The dams 120, 125 are typically formed from any suitable epoxy resin material compatible with the substrate 100. One example of a material suitable to construct the dams is a resin, part number FP4451, available from Dexter, Inc. of Industry, California.

The dams 120, 125 extend upward from and can be substantially perpendicular to the top surface 108 of the substrate 100. In other arrangments, the dams can have a cross-sectional shape resembling a gaussian or normal distribution (i.e., with curved, sloping walls), as will be better understood from the description below.

In alternative arrangements, dams can be formed to extend half of the bump height. Preferably, however, the dams 120, 125 each extend at least as high as the gap 180 created by the bumps 175, as shown. For purposes of illustration, FIG. 2 shows one dam 120 extending the full height of the assembly (i.e., the height of the gap 180 plus the thickness of the flip-chip 110), while the other dam 125 is shown extending only as high as the gap 180. It will be understood that the dams in actual embodiments will typically have the same height, and that the preferred height can range between the two illustrated heights.

As shown, the dam 120 is formed as a right angle with one leg lying substantially parallel to the front wall 112 and with one leg lying parallel to the sidewall 115 of the flip-chip 110. The dam 120 limits the expansion or gravitational flow of the underfill material 190 beyond the position of the dam 120. During the underfill procedure, the underfill material 190 coats and spreads out onto the surfaces of the flip-chip 110 and substrate 100. The dam 120 prevents the spread of underfill material 190 substantially beyond the front wall 112 and the sidewall 114 of the flip-chip 110 by means of surface tension.

The dam 125 is also formed at almost a right angle with one leg lying substantially parallel to the rear wall 114 and one leg lying substantially parallel to the sidewall 113 of the flip-chip 110. The dam 125 limits the expansion or gravitational flow of the underfill material 190 substantially beyond the position of the dam 125. During the underfill procedure, the dam 125 prevents the spread of underfill material 190 beyond the rear wall 114 and the sidewall 113 of the flip-chip 110 by means of surface tension.

Additionally, the use of the dams 120, 125 permits use of lower viscosity underfill materials 190, if so desired, during the underfill procedure, providing for improved underfill dynamics. The viscosity of the underfill material 190 may be easily controlled, as will be appreciated by the skilled artisan, and a wider range of viscosities may be used by controlling the depth of the dams 120, 125 and the lateral gaps between the walls 112, 113, 114, 115 of the flip-chip 110 and the dams 120, 125. Use of the dams 120, 125 also permits applying a vacuum pressure in order to accelerate the underfill process or to permit the use of higher viscosity underfill materials 190. The dams 120, 125 may be positioned to touch the flip-chip 110 to form a seal between the dams 120, 125 and the flip-chip 110 to assist in creating a vacuum in the gap 180.

Figure 3:
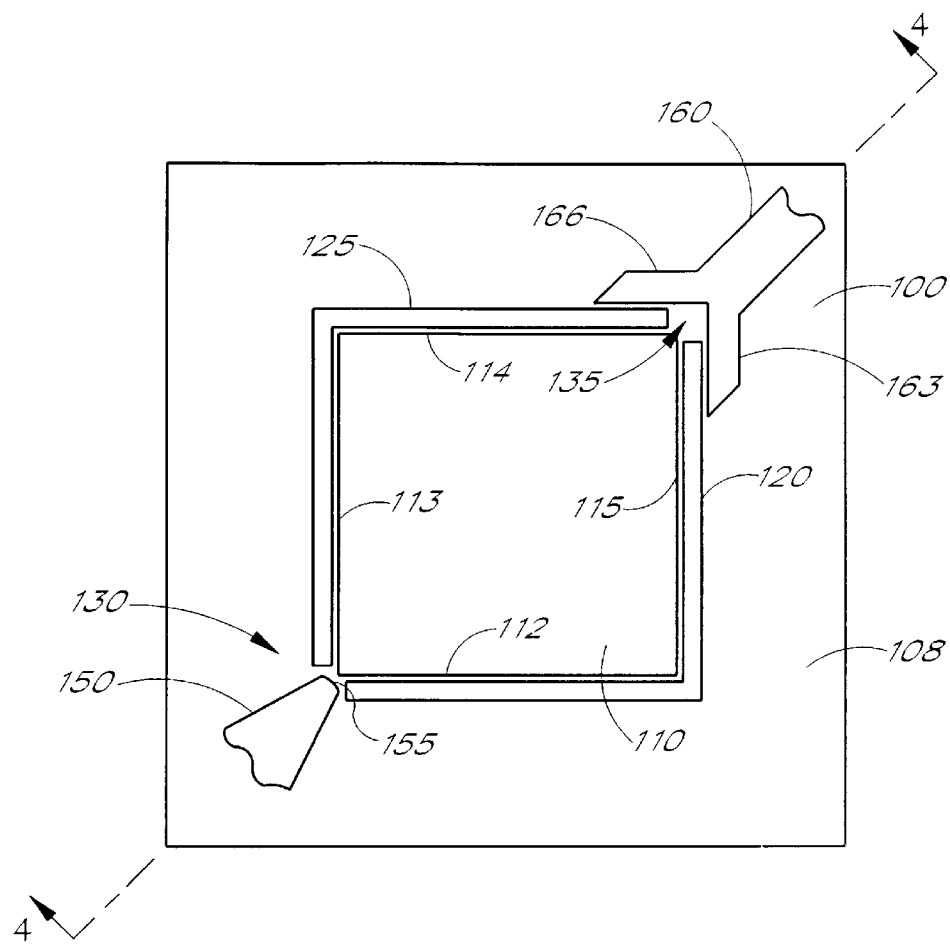
FIG. 3 is a top plan view of the surface mounted chip and the dam of FIG. 1, further including a dispensing needle and a vacuum source positioned in accordance with the first embodiment.
Figure 4:
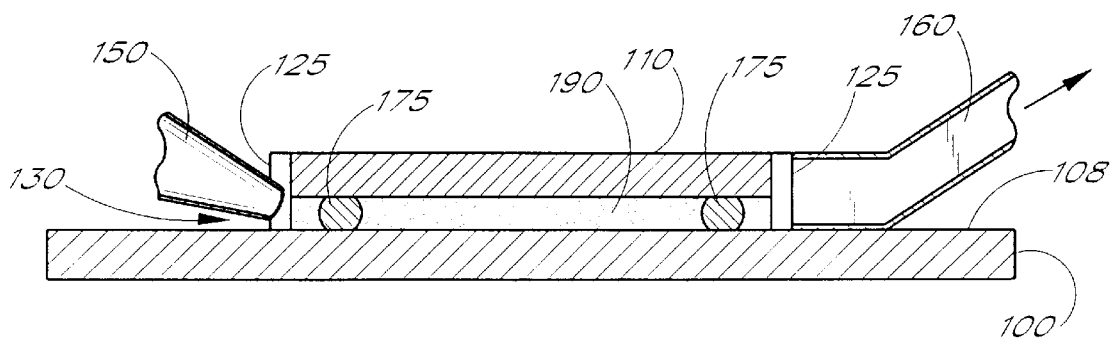
FIG. 4 is a cross-sectional view of the surface mounted chip of FIG. 3 showing the gap filled with underfill material.

FIGS. 3 and 4 illustrate a view of the interconnected flip-chip 110 and the substrate 100 of an embodiment of the present invention during the underfill process. In the embodiment shown in FIGS. 3 and 4, the underfill material 190 is applied via an underfill dispenser 150 through the opening 130. The underfill dispenser may advantageously be a syringe having a suitable needle or nozzle 155 or any other dispensing means known in the art.

The illustrated dams 120, 125 located along each wall 112, 113, 114, 115 of the flip-chip 110 are molded or suitably attached to top surface 108 of the substrate 100 as described above. In other arrangements, the dams can be formed by dispensing standard glob top materials through a nozzle, in which case the dams would have a cross-section resembling a gaussian distribution. The dams 120, 125 are positioned to extend around the walls 112, 113, 114, 115 of the flip-chip 110 to substantially surround or enclose the die 110, thereby confining the underfill material 190.

As seen in FIG. 4, the underfill material 190 is applied to fill the gap 180 or interstices between the flip-chip 110 and the substrate 100. The underfill material 190 performs a variety of functions, including environmentally sealing the active surface 118 of the flip-chip 110 and the bumps 175, providing an additional mechanical bond between the flip-chip 110 and the substrate 100, distributing stress among the flip-chip 110 and the bumps 175, and transferring heat from the flip-chip 110. The underfill material 190 is typically a polymeric material, such as an epoxy or an acrylic resin and may contain inert filler material therein. The underfill material 190 typically has a thermal coefficient of expansion that approximates that of the flip-chip 110 and/or the substrate 100, to help minimize stress placed on either the flip-chip 110 or the substrate 100 caused by the heating of the flip-chip 110 during the operation of the flip-chip 110. To promote filling of the gap 180 between the substrate 100 and flip-chip 110, the viscosity of the underfill material 190 is controlled to account for the flow characteristics of the underfill material 190, the material characteristics of the substrate 100, the material characteristics of the flip-chip 110, and the size of the gap 180. One example of a suitable underfill material 190 is part number X43-5107-2 from Ciba, Inc., of Los Angeles, Calif.

Underfilling is accomplished by applying the underfill material 190 into an opening 130 at a first corner of the flip-chip 110 created by the intersection of the front wall 112 and the sidewall 113. The underfill material 190 flows between the flip-chip 110 and the substrate 100 and around the bumps 175. The underfill material 190 is applied using the underfill dispenser 150.

As shown, a vacuum cup 160 is placed over an opening 135 at a second corner of the flip-chip 110 where the sidewall 115 and the rear wall 114 intersect. In the illustrated embodiment, the opening 135 is diagonally across from the opening 130. The vacuum cup 160 transfers a suction force from an external vacuum source (not shown) to the assembly of the flip-chip 110 and the substrate 100. This vacuum force acts on the underfill material 190 to draw the underfill material 190 into the gap 180. The vacuum force is in addition to any fluid pressure used to inject the underfill material 190 and any capillary action acting on the underfill material 190. The combination of each of these forces causes the underfill material 190 to readily flow from one sidewall 113 toward the other sidewall 115. Due to the additional action of the vacuum force to that of the injection pressure and capillary action, air pockets, bubbles, and voids found within the underfill material 190 are displaced by the denser underfill material 190 as it flows under the flip-chip 110. The ability to displace and the speed of displacement of the voids depends upon the vacuum pressure, the viscosity of the underfill material 190, the injection rate of the underfill material 190, and the uniformity of the injection of the underfill material 190 into the gap 180 between the substrate 100 and the flip-chip 110. After application of the underfill material 190, the material is cured either by heat, ultraviolet light, radiation, or other suitable means in order to form a solid mass.

Figure 5:
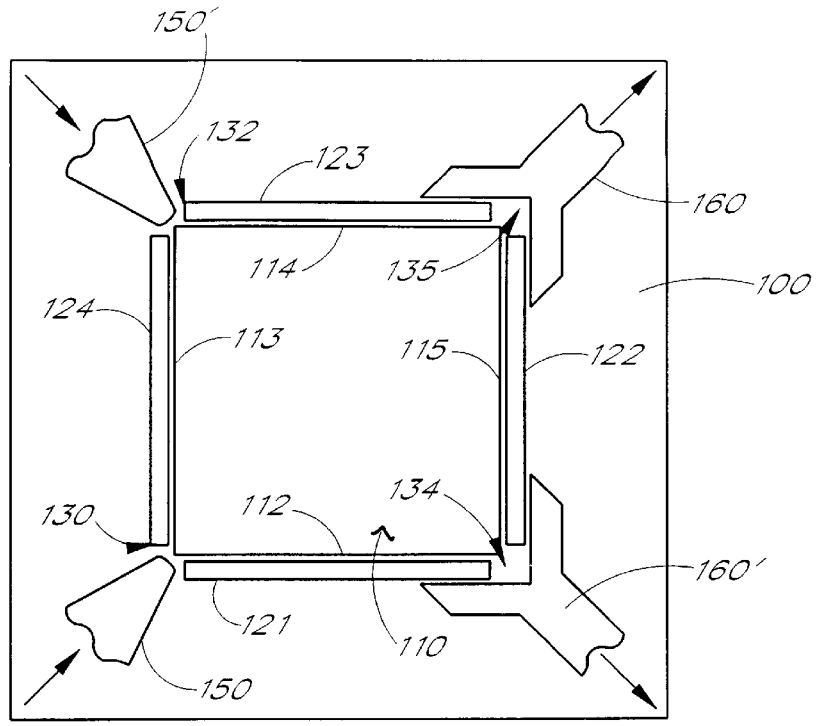
FIG. 5 is a top plan view of a surface mounted chip and dam constructed in accordance with a second embodiment, further including multiple dispensing needles and multiple vacuum sources positioned in accordance with one process.

FIG. 5 illustrates another embodiment of the invention using multiple underfill dispensers 150, 150' and multiple vacuum cups 160, 160'. In this embodiment, a plurality of dams 121, 122, 123, 124 are placed along the walls 112, 113, 114, 115 of the flip-chip 110, respectively. The dam 121 extends parallel to the front wall 112. The dam 122 extends parallel to the sidewall 115. The dam 123 extends parallel to the rear wall 114. The dam 124 extends parallel to the sidewall 113. The dams 121, 122, 123, 124 may be spaced slightly apart from the flip-chip 110 as shown, or the dams 121, 122, 123, 124 may abut the flip-chip 110. The length of the dams 121, 122, 123, 124 are selected to ensure the dams 121, 122, 123, 124 do not touch one another. This creates four separate openings 130, 132, 134, 135 at the corners of the flip-chip 110.

In addition to the underfill dispenser 150 and the vacuum cup 160 shown in the previous embodiments, the device in FIG. 5 includes a second underfill dispenser 150' positioned in the opening 132 and a second vacuum cup 160' positioned in the opening 134. During the underfill process, the underfill material 190 is inserted into the gap 180 (see FIG. 4) between the flip-chip 110 and the substrate 100 from both underfill dispensers 150 and 150'. The vacuum cups 160 and 160' provide suction forces to draw the underfill material 190 from the sidewall 113 to the sidewall 115. The vacuum cups 160 and 160' can be connected to a single vacuum source (not shown) or may be connected to multiple, separate vacuum sources.

Figure 6:
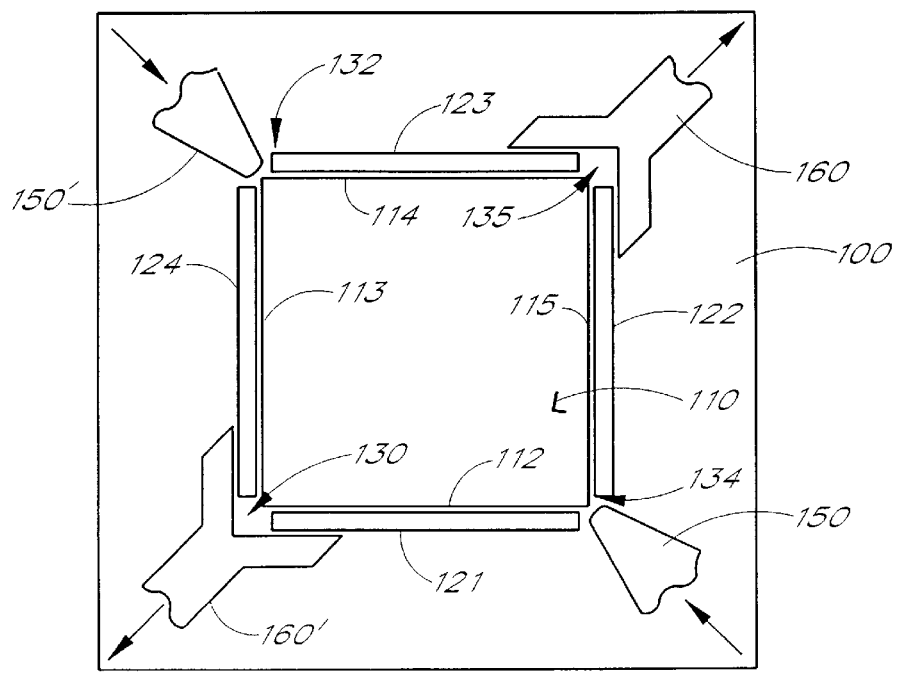
FIG. 6 is a top plan view of the surface mounted chip and dam of FIG. 7, including multiple dispensing needles and multiple vacuum sources positioned in accordance with another process.

FIG. 6 illustrates another embodiment of the invention using multiple underfill dispensers 150, 150' and multiple vacuum cups 160, 160'. The device in FIG. 6 includes the first underfill dispenser 150 positioned in the opening 134. The second underfill dispenser 150' is positioned in the opening 132, diagonally opposite the first dispenser 150. The first vacuum cup 160 is positioned in the opening 135. The second vacuum cup 160' is positioned in the opening 130, diagonally opposite the first cup 160. During the underfill process, the underfill material 190 is inserted into the gap 180 between the flip-chip 110 and the substrate 100 from both underfill dispensers 150 and 150'. The vacuum cups 160 and 160' provide suction forces to draw the underfill material 190 into the openings 132 and 134 and through the gap 180 to the openings 130 and 135. As with the embodiment shown in FIG. 5, the vacuum cups 160 and 160' may be connected to a single vacuum source (not shown) or may be connected to multiple, separate vacuum sources.

While FIGS. 5 and 6 illustrate two dispensers and two vacuum cups, the skilled artisan will readily appreciate that combinations of two dispensers and one vacuum cup, or vice versa, can also be employed. Moreover, use of dams in other geometric configurations will result in other efficient combinations of dispensers and vacuum cups.

Figure 7:
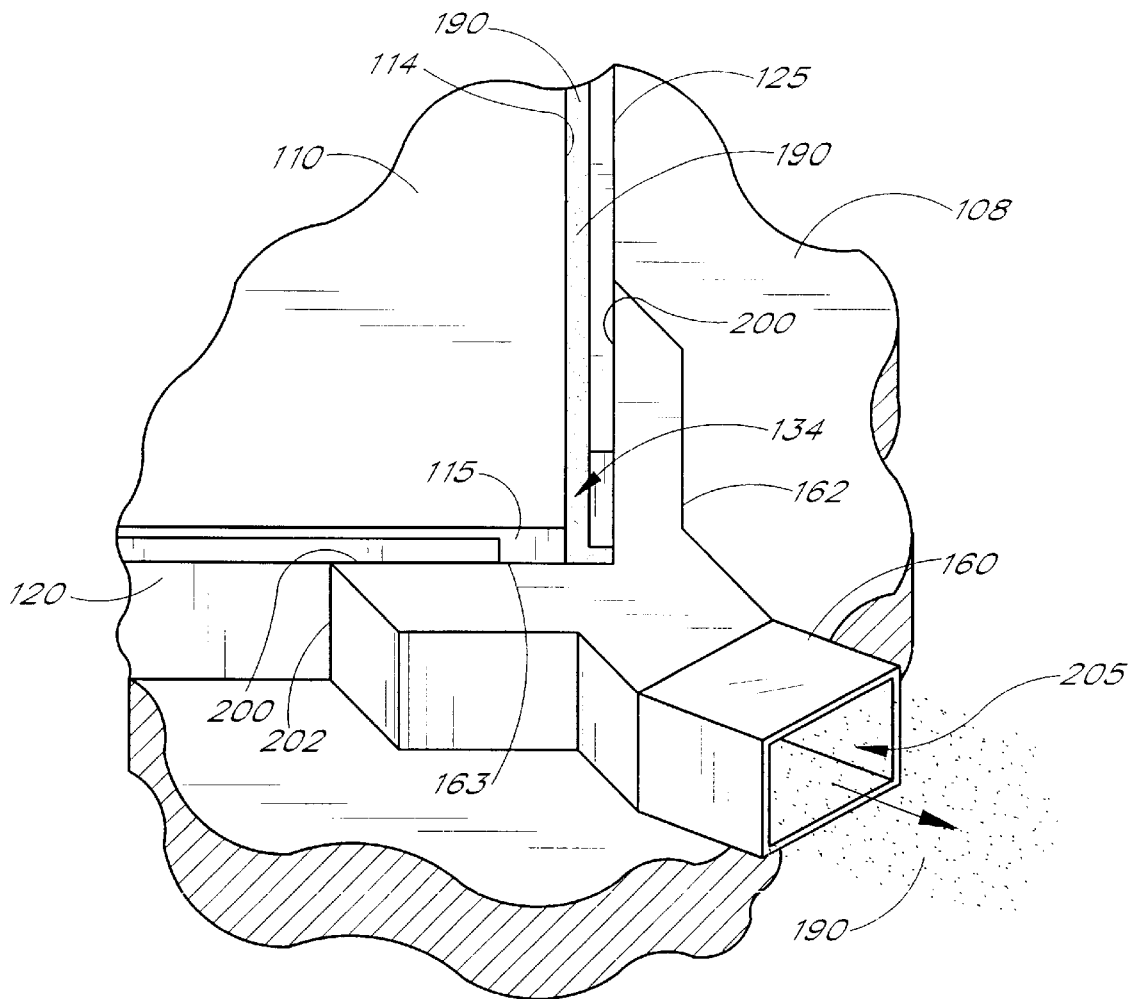
FIG. 7 is an enlarged perspective view of a vacuum cup/dam interface according to the preferred embodiments.
Figure 8:
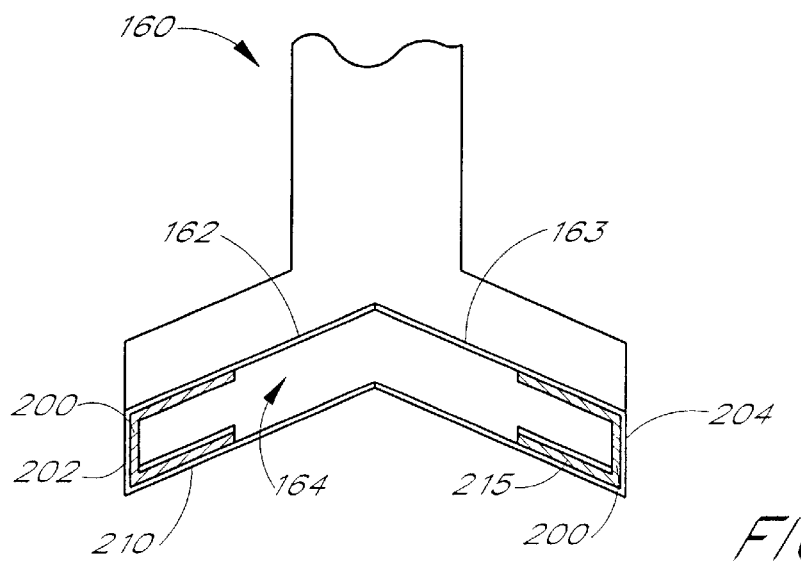
FIG. 8 is a partial perspective view of the vacuum cup of FIG. 7.

FIGS. 7 and 8 show detailed views of the vacuum cup 160 interfacing with the dams 120 and 125. The vacuum cup 160 has an opening 164, which is designed to fit around the dams 120 and 125. The opening 164 is formed below a first wall 162 and a second wall 163 of the vacuum cup 160. The first wall 162 is connected to the second wall 163 at approximately a right angle to match the shape of the flip-chip 110 and dam 120, 125 assembly. When the vacuum cup 160 is connected to the dams 120 and 125, a vacuum source draws air and underfill material 190 through the gap 180 and into the opening 164. Any excess underfill material 190 flows through the vacuum cup 160 and out a second opening 205 into a conduit (not shown) toward the vacuum source (not shown). The suction provided by the vacuum cup 160 assists in ensuring the underfill material 190 flows evenly throughout the gap 180 and is free of voids. Preferably, the vacuum source (not shown) includes a control device which senses a change in pressure that occurs when the gap 180 is filled so that the vacuum is released when the underfill starts entering the vacuum cup 160.

The vacuum cup 160 preferably also contains gaskets 200 to create a seal with the dams 120 and 125. The gaskets 200 are placed around a periphery of the opening 164 as seen in FIG. 8. The gaskets 200 extend along the walls 162, 163, along the sides 202 and 204, and also along bottom walls 210 and 215. When the vacuum cup 160 is positioned to directly abut the dams 120 and 125, the gaskets 200 create an airtight seal between the vacuum cup 160 and the dams 120 and 125. By having an airtight seal, the force created by the vacuum source is enhanced.

Figure 9:
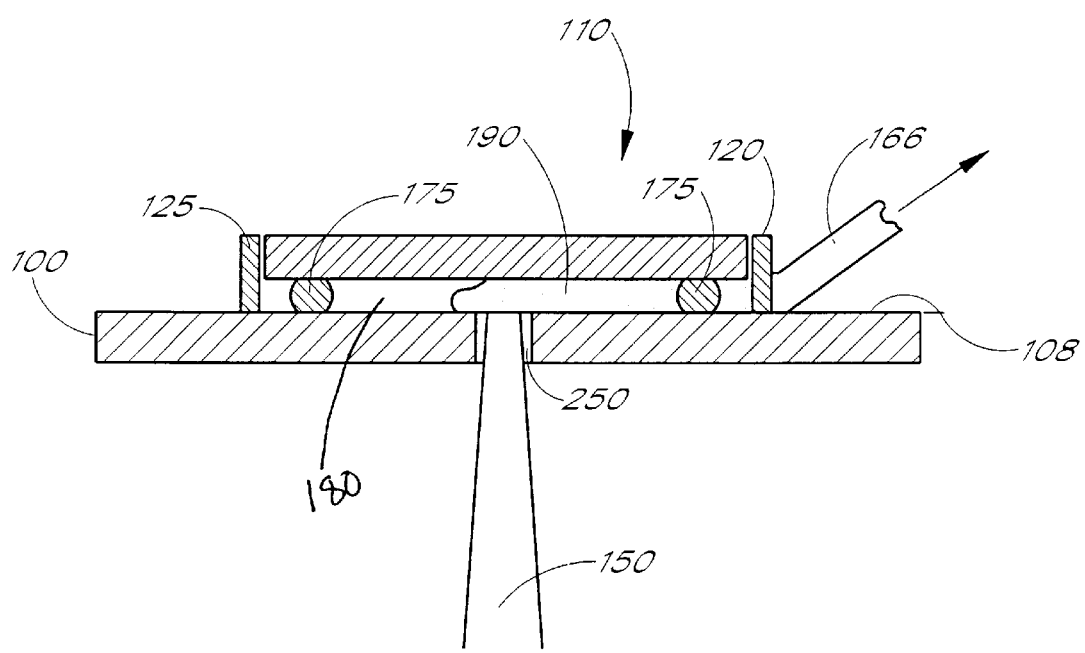
FIG. 9 is a cross-sectional view of a surface mounted chip and dam similar to the cross-sectional view of FIG. 4, but with an aperture through the substrate, which permits a bottom fill technique according to an alternate embodiment of the present invention.

FIG. 9 is a cross-sectional view of a surface mounted chip and dam similar to the cross-sectional view of FIG. 4 but with an aperture through the substrate 100, which permits a bottom fill technique according to an alternate embodiment of the present invention. As shown in FIG. 9, the substrate 100 contains an aperture 250 through which the underfill dispenser 150 may be inserted. The dams 120 and 125 are integrated to substantially enclose the entire flip-chip 110 with the exception of an opening for the vacuum cup 160. The underfill material 190 is inserted through the aperture 250 and into the gap 180. As the underfill material 190 flows into the gap 180, the vacuum cup 160 draws the underfill material 190 throughout the gap 180 in a uniform manner to create a void-free underfill. Multiple vacuum sources may also be used with the bottom fill technique.

Numerous variations and modifications of the invention will become readily apparent to those skilled in the art. Accordingly, the invention may be embodied in other specific forms without departing from its spirit or essential characteristics. The detailed embodiment is to be considered in all respects only as illustrative and not restrictive and the scope of the invention is, therefore, indicated by the appended claims rather than by the foregoing description. All changes which come within the meaning and range of equivalency of the claims are to be embraced within their scope.

We claim:

1. A method of attaching a semiconductor device to a substrate, the method comprising:

electrically and mechanically connecting the semiconductor device to the substrate, leaving a gap therebetween;

providing a dam on the substrate substantially surrounding the semiconductor device, the dam having at least a first opening and a second opening;

inserting an underfill material into the gap from the first opening of the dam; and applying a continuous vacuum to the second opening of the dam to draw the underfill material into the gap.

2. The method of claim 1, wherein the vacuum draws the underfill material into the gap.

3. The method of claim 1, wherein the first opening is at a first corner of the dam and the second opening is at a second corner of the dam.

4. The method of claim 1, wherein the underfill is inserted with a dispensing needle.

5. The method of claim 1, wherein a vacuum cup forms a seal with the dam.

6. The method of claim 1, wherein the underfill is inserted through a first plurality of openings of the dam.

7. The method of claim 6, wherein each opening is in a corner of the dam.

8. The method of claim 1, wherein the vacuum is applied to a second plurality of openings in the dam.

9. The method of claim 8, wherein each opening is in a corner of the dam.

10. The method of claim 1, wherein providing the dam comprises dispensing a glob top fence onto the substrate.

11. The method of claim 1, wherein providing the dam comprises forming the dam at least as high as the gap.

12. A process for underfilling a device on a substrate comprising:
   positioning the device on a substrate such that a space is created between the device and the substrate, the device having a plurality of sides;
   substantially enclosing the plurality of sides of the device with a dam;
   inserting an underfill material into at least a first opening in the dam; and
   drawing the underfill material into the space toward a second opening in the dam with a continuous vacuum.

13. The process of claim 12, wherein the dam creates a substantial seal against the plurality of sides of the semiconductor device.

14. The process of claim 12, wherein the semiconductor device and the dam have a generally rectangular shape.

15. The process of claim 14, wherein the first opening is located at a first corner of the dam.

16. The process of claim 15, wherein the second opening is located cater-cornered from the first opening.

17. The process of claim 12, wherein the underfill material is drawn using a vacuum.

18. The process of claim 17, wherein the vacuum is applied by a vacuum cup.

19. The process of claim 18, wherein the vacuum cup creates a seal with the dam.

20. The process of claim 17, wherein the vacuum is applied to a second plurality of openings in the dam.

21. The process of claim 12, wherein the underfill material is inserted into a first plurality of openings in the dam.

22. The process of claim 12, wherein the second opening is at a lower pressure than the first opening.

23. An apparatus for allowing uniform flow of underfill material in interstices between a semiconductor device and a substrate, the apparatus comprising:
   a first dam adjacent a first section of the semiconductor device and a second dam adjacent a second section of the semiconductor device;
   an underfill dispenser positioned proximate the first dam which injects underfill material into the interstices between the semiconductor device and the substrate; and
   a vacuum cup positioned proximate the second dam, wherein the vacuum cup provides a continuous suction force to draw the underfill material throughout the interstices.

24. The apparatus of claim 23, wherein the underfill dispenser is located at a first corner of the semiconductor device.

25. The apparatus of claim 24, wherein the vacuum cup is located cater-cornered from the underfill dispenser.

26. The apparatus of claim 23, wherein the underfill material is drawn using a vacuum.

27. The apparatus of claim 23, wherein the vacuum cup creates a seal with the first dam and the second dam.

28. The apparatus of claim 23, wherein the first and second dams are molded.

29. The apparatus of claim 23, wherein the first and second dams have cross-sections resembling gaussian distributions.

30. The apparatus of claim 23, wherein the first and second dams are at least as high as the interstices.

31. A device for obtaining a void-free underfill in the space between a semiconductor device and a substrate, the device comprising:
   means for substantially enclosing the semiconductor device;
   means for injecting underfill material into the space between the semiconductor device and the substrate; and
   means for continuously drawing the underfill material throughout the space.

32. The device of claim 31, wherein the means for substantially enclosing the semiconductor device comprises a dam extending from the substrate around the perimeter of the semiconductor device, the dam having at least two openings therein.

33. The device of claim 32, wherein the openings are formed at corners of the dam.

34. A process for underfilling a device on a substrate comprising:
   positioning the device on a substrate such that a space is created between the device and the substrate, the device having a plurality of sides;
   enclosing the plurality of sides of the device with a dam;
   inserting an underfill material into an aperture in the substrate within the area beneath the device, and
   drawing the underfill material into the space toward an opening in the dam with a continuous vacuum.

35. The process of claim 34, wherein the dam creates a seal against the plurality of sides of the semiconductor device.

36. The process of claim 34, wherein the semiconductor device and the dam have a generally rectangular shape.

37. The process of claim 36, wherein the opening is located at a corner of the dam.

38. The process of claim 34, wherein the underfill material is drawn using a vacuum.

39. The process of claim 38, wherein the vacuum is applied by a vacuum cup.

40. The process of claim 39, wherein the vacuum cup creates a seal with the dam.

41. The process of claim 34, wherein the vacuum is applied to a plurality of openings in the dam.

42. A device mounted to a substrate comprising:
   a dam connected to the substrate, the dam substantially enclosing the device and having at least a first opening at a first corner of the device and having at least a second opening at a second corner of the device; and
   an underfill material positioned within a gap between the device and the substrate, the underfill material increasing the mounting strength of the device to the substrate, wherein the underfill material is drawn into the gap between the device and the substrate using a continuous vacuum.

43. The device of claim 42, wherein the second corner is diagonally across from the first corner.

44. The device of claim 42, wherein the dam is made of epoxy resin.

45. The device of claim 42, wherein the dam has a third opening at a third corner of the device and having a fourth opening at a fourth corner of the device.

46. A semiconductor mounting device comprising:
a substrate having a plurality of electrical contacts;
a semiconductor device connected to the plurality of electrical contacts of the substrate such that a gap is formed between the semiconductor device and the substrate;
a first dam positioned proximate a first side and a second side of the semiconductor device;
a second dam positioned proximate a third side and a fourth side of the semiconductor device, and
an underfill material positioned within the gap formed between the semiconductor device and the substrate to completely fill the gap, the underfill material extending from the first dam to the second dam, wherein the underfill material flows into the gap while applying a vacuum.

47. The semiconductor mounting device of claim 46, wherein the first and second dams are formed at approximate right angles.

48. The semiconductor mounting device of claim 46, wherein the first and second dams substantially enclose the semiconductor device.

49. The semiconductor mounting device of claim 46, further comprising openings between the first and second dams at a plurality of corners of the semiconductor device.

50. The semiconductor mounting device of claim 46, wherein the first and second dams stops the flow of the underfill material.

* * * * *